United States Patent
Nemoto

(10) Patent No.: US 9,704,630 B2
(45) Date of Patent: Jul. 11, 2017

(54) SUPERCONDUCTING MAGNET, MRI APPARATUS AND NMR APPARATUS

(71) Applicant: Hitachi, Ltd., Chiyoda-ku, Tokyo (JP)

(72) Inventor: Takeo Nemoto, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 90 days.

(21) Appl. No.: 14/887,983

(22) Filed: Oct. 20, 2015

(65) Prior Publication Data

US 2016/0116555 A1    Apr. 28, 2016

(30) Foreign Application Priority Data

Oct. 23, 2014  (JP) .................. 2014-216133

(51) Int. Cl.
*H01F 6/04* (2006.01)
*H01F 6/00* (2006.01)
*G01R 33/3815* (2006.01)
*G01R 33/38* (2006.01)

(52) U.S. Cl.
CPC ............... *H01F 6/04* (2013.01); *H01F 6/00* (2013.01); *G01R 33/3804* (2013.01); *G01R 33/3815* (2013.01)

(58) Field of Classification Search
CPC .......... H01F 6/00; H01F 6/04; H01J 37/1416; Y10S 505/871
See application file for complete search history.

(56) References Cited

FOREIGN PATENT DOCUMENTS

| EP | 0 874 376 A2 | 10/1998 | |
|----|----|----|----|
| JP | 8-69911 A | 3/1996 | |
| JP | WO 9711472 A1 * | 3/1997 | ............... H01F 6/04 |
| JP | 10-294213 A | 11/1998 | |
| JP | 2004-179413 A | 6/2004 | |
| JP | 2011-82229 A | 4/2011 | |

* cited by examiner

*Primary Examiner* — Mohamad Musleh
(74) *Attorney, Agent, or Firm* — Crowell & Moring LLP

(57) ABSTRACT

Provided superconducting magnet allowing the temperature of the permanent current switch to be quickly lowered and the excitation time of the superconducting magnet to be shortened, an MRI apparatus and an NMR apparatus having the superconducting magnet. A superconducting magnet structure is disclosed in which a superconducting coil 1 is connected to a second stage 22 of a refrigerating unit 2 through a low-temperature-side highly thermal conductor 3 and a permanent current switch 4 covered by a highly thermal conductor 5 is connected to a second stage 22 of the refrigerating unit 2 through a heat insulator 6 and a low-temperature-side highly thermal conductor 3. Gas is supplied from a gas bottle 8 disposed outside a vacuum vessel 16 to a condenser 11 in a thermal shield 12. In addition, a first pipe 14 that supplies condensate liquid to a liquid storage chamber 7 is provided. The liquid storage chamber 7 is disposed at an upper portion of the permanent current switch 4. A check valve 13 is connected to the first pipe 14.

10 Claims, 10 Drawing Sheets

SUPERCONDUCTING MAGNET, MRI APPARATUS AND NMR APPARATUS

TECHNICAL FIELD

The present invention relates to a high-temperature superconducting magnet that is used for a refrigerating unit and to an MRI apparatus and an NMR apparatus having the same.

BACKGROUND ART

PTL 1 describes an invention of a superconducting magnet that is used for a refrigerating unit and that generates a strong magnetic field, not quenches even if the refrigerating unit stops due to a short time power outage, a water cutoff, or the like. The superconducting magnet is provided with a refrigerating member having a refrigerating pipe that protrudes from a vacuum vessel and that is connected to a helium gas vessel filled with helium gas through a pressure and flow rate adjustment unit that adjusts an inner pressure of the refrigerating pipe to a critical pressure of helium gas.

CITATION LIST

Patent Literature

PTL 1: JP 8-69911 A

SUMMARY OF INVENTION

Technical Problem

An NMR (Nuclear Magnetic Resonance) apparatus and a medical MRI (Magnetic Resonance Imaging) apparatus, respectively, are an analyzing device and an image diagnosing device that use the magnetic resonance phenomenon. These devices use superconducting magnets since the magnet has a property in which as a magnetic field is enhanced, a S/N ratio is improved. Since the superconducting critical temperature of conventional superconducting wire (made of NbTi) is approximately 9 K, a superconducting magnet formed of the superconducting wire in a coil shape is refrigerated by liquid helium having a temperature of 4.2 K.

However, since liquid helium is hard to obtain, a helium refrigerating unit that refrigerates the superconducting magnet has been used recently. In addition, high-temperature superconducting magnets made from a high-temperature superconducting material having a superconducting property at relatively high temperatures have been developed. In other words, instead of using liquid helium, a conductive-cooling structure combined with a helium refrigerating unit for high-temperature superconducting-magnet has been developed. An example of the high temperature superconducting materials is $MgB_2$ (magnesium diboride).

Like a conventional superconducting magnet made from low-temperature superconducting wire that has a superconducting property at a temperature of approximately 9 K and that is refrigerated by liquid helium, when a conductive-cooling type high-temperature superconducting-magnet made from a $MgB_2$ wire that has a superconducting property at a temperature of approximately 40 K is refrigerated by a refrigerating unit and excited by electric power, the magnet allows current to permanently flow in the superconducting coil without need to use electric power. This phenomenon of the conductive-cooling type high-temperature superconducting magnet is equivalent to the so-called permanent current mode of a superconducting magnet.

As an advantage of the permanent current mode of the superconducting magnet, once it is excited, it does not need electric power. In addition, it does not generate a power noise. When the superconducting magnet is used for an MRI, as its advantage, the resolutions of MRI images do not change.

A permanent current switch has an internal heater and a superconducting wire. When the superconducting wire is heated by the heater to a temperature exceeding the superconducting critical temperature, the superconducting wire becomes a normal conducting state (OFF state). On the other hand, when the heater is turned off, the temperature of the superconducting wire in the permanent current switch is refrigerated below the superconducting critical temperature. As a result, the superconducting wire in the permanent current switch becomes the superconducting state (ON state).

However, when such a permanent current switch and a conductive-cooling type high-temperature super conducting magnet are refrigerated by a refrigerating unit, the heat generated by a heater used to turn off the permanent current switch is adversely conducted to the high-temperature superconducting magnet. Depending on the heating amount, due to the heat load that is conducted to the high-temperature superconducting magnet, the refrigerating unit of the high refrigerating capacity is used, resulting in a problem of an increased operation cost for the refrigerating unit.

To shorten the excitation time of the superconducting magnet, current that flows in the superconducting coil needs to be quickly increased to a target current value so that the current is caused to flow in the superconducting coil in a short time. The time necessary to excite the superconducting coil is the sum of the time after the heater of the permanent current switch is energized to change the superconducting state of the superconducting wire in the permanent current switch to the normal conducting state until the superconducting coil is energized and the time after the permanent current switch is refrigerated to change the normal conducting state to the superconducting state until the current of the exciting power is decreased to 0.

When the superconducting coil is excited, the permanent current switch needs to be heated. However, since heat that is conducted to the superconducting coil increases and the temperature of the superconducting coil rises, the amount of heat cannot be increased. In other words, the heat of the permanent current switch should not be conducted to the superconducting coil. To prevent heat from being conducted to the superconducting coil, the permanent current switch may be connected to the refrigerating unit through a heat insulator. However, when the permanent current switch is refrigerated, the heat insulator prevents the permanent current switch from being refrigerated. As a result, the permanent current switch adversely takes a long refrigerating time.

In the structure according to the invention described in PTL 1, the permanent current switch is fixedly connected to the refrigerating unit. Thus, since the amount of heat that causes the permanent current switch to change from the superconducting state to the normal conducting state increases, the superconducting coil itself also becomes the normal conducting state. As a result, exciting the superconducting coil becomes difficult.

An object of the present invention is to provide a superconducting magnet having a permanent current switch including an inner superconducting wire and an inner heater that heats the superconducting wire to change itself from the superconducting state to the normal conducting state, the superconducting magnet allowing the temperature of the permanent current switch to be quickly lowered and the excitation time of the superconducting magnet to be shortened and also to provide an MRI apparatus and an NMR apparatus having the superconducting magnet.

Solution to Problem

To solve the foregoing problem, structures described for example in claims are used.

The present invention includes multiple means to achieve the above-described object, and an example thereof is a superconducting magnet including: a refrigerating unit; a vacuum container; a thermal conductor disposed in the vacuum container; a permanent current switch that is thermally connected to the refrigerating unit through the thermal conductor and that has a superconducting coil disposed in the vacuum container; a liquid storage chamber; a condenser; a first pipe that supplies gas from an outer portion of the vacuum container to the liquid storage chamber through the condenser; a second pipe that discharges the gas from the liquid storage chamber to the outer portion of the vacuum vessel; and a check valve disposed in the first pipe so as to prevent the gas from flowing from the liquid storage chamber to the outer portion of the vacuum container.

Advantageous Effects of Invention

According to the present invention, the temperature of the permanent current switch can be quickly lowered so as to shorten the excitation time of the superconducting magnet.

DESCRIPTION OF EMBODIMENTS

Next, a superconducting magnet according to the present invention and an MRI apparatus and an NMR apparatus that have the superconducting magnet will be described with reference to the accompanying drawings.

First Embodiment

Figure 1:
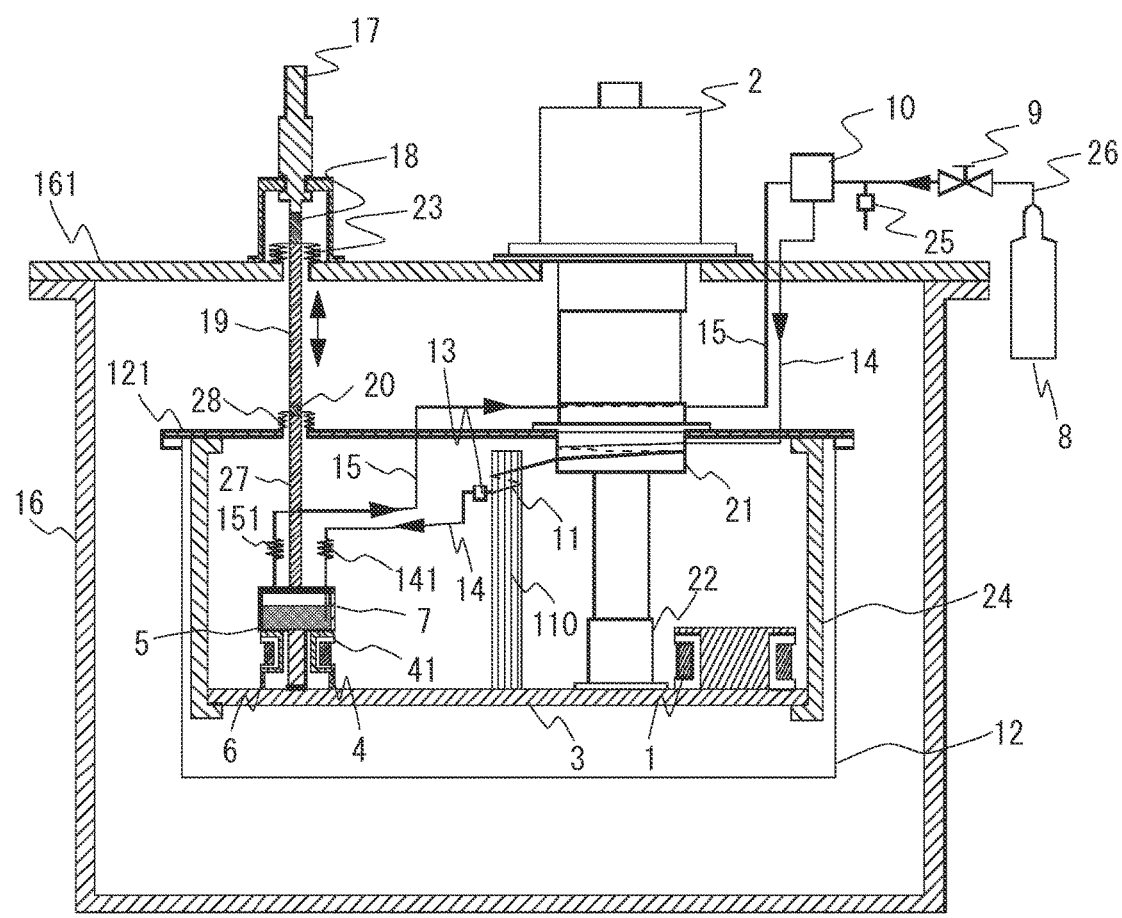
FIG. 1 is a schematic diagram showing an example of a cross section of a superconducting magnet according to a first embodiment of the present invention.
Figure 2:
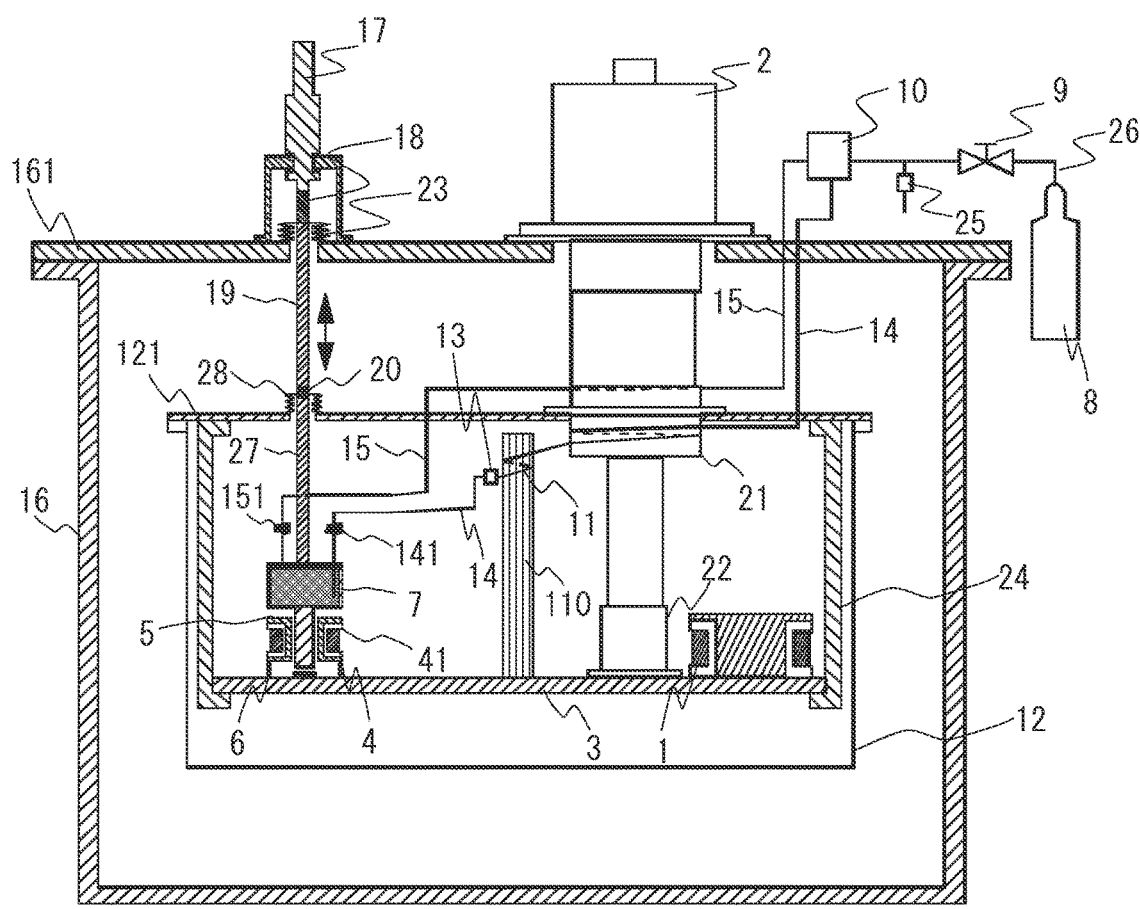
FIG. 2 is a schematic diagram showing another example of the cross section of the superconducting magnet according to the first embodiment of the present invention.
Figure 3:
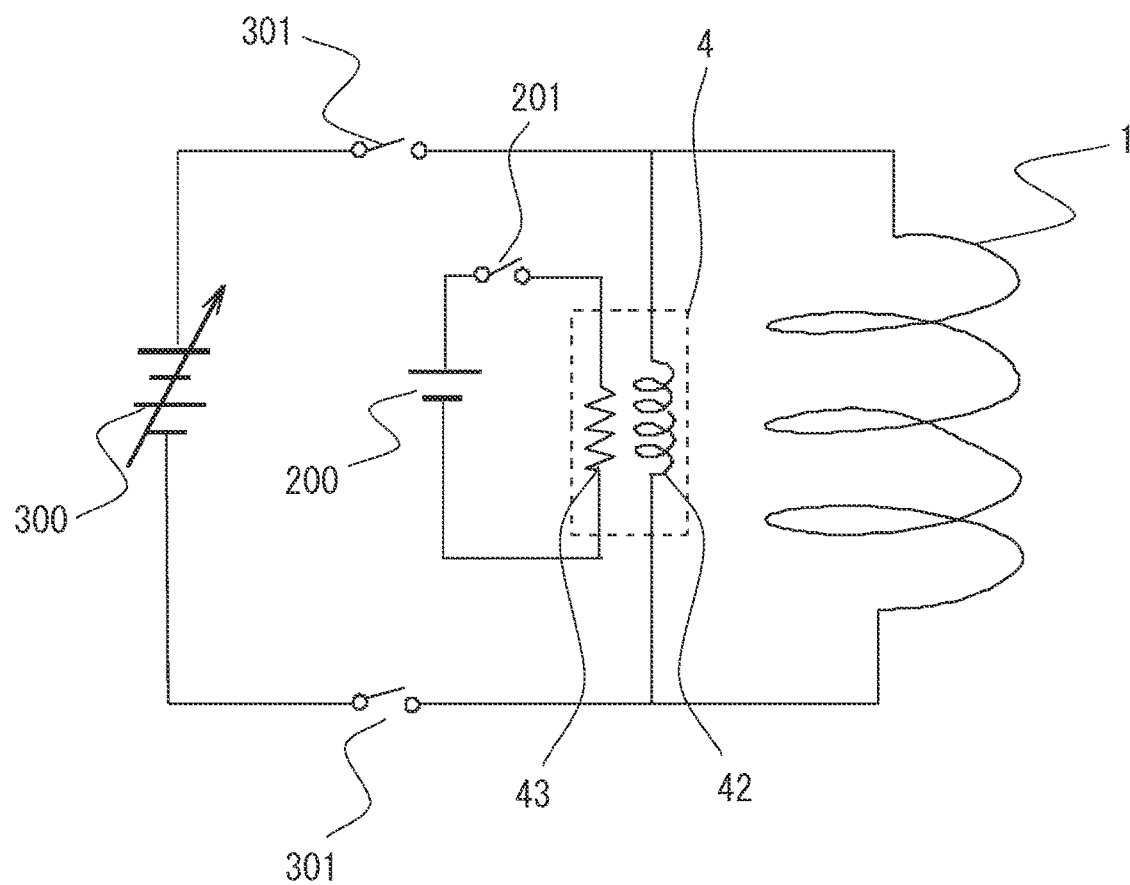
FIG. 3 is a schematic diagram showing an example of an exciting circuit of the superconducting magnet according to the first embodiment of the present invention.

With reference to FIG. 1 to FIG. 3, a superconducting magnet according to a first embodiment of the present invention will be described.

FIG. 1 is a schematic diagram showing a superconducting magnet according to the present embodiment, FIG. 2 is a sectional view showing the superconducting magnet according to this embodiment in which a liquid storage chamber moves away from a permanent current switch, and FIG. 3 is an electric circuit diagram that excites a superconducting magnet according to the present embodiment.

In FIG. 1, a superconducting coil 1 is made from a superconducting wire having a superconducting critical temperature of 39 K or higher. The superconducting coil 1 is disposed on an upper surface of a low-temperature-side highly thermal conductor 3 thermally connected to a second stage 22 of a refrigerating unit 2 that will be described later.

The refrigerating unit 2 is a two-stage type refrigerating source having a first stage 21 and the second stage 22 that have different refrigerating capacities. The refrigerating capacity of the first stage 21 of the refrigerating unit 2 is 60 W at a temperature of 40 K and the refrigerating capacity of the second stage 22 of the refrigerating unit 2 is 1 W at a temperature of 4 K. Thus, the refrigerating unit 2 has a sufficient refrigerating capacity for which the superconducting coil 1 is refrigerated.

A heat shield 12 and a heat shield flange 121 are shielding members that shield heat radiated from a vacuum vessel 16 and a vacuum vessel flange 161 and are connected to the first stage 21 of the refrigerating unit 2. The heat shield 12 and the heat shield flange 121 are made of a material having a high thermal conductivity such as copper or aluminum.

The vacuum vessel 16 is a chamber that prevents heat of air from being conducted to the heat shield 12, the superconducting coil 1, and so forth disposed inside the heat shield 12. The vacuum vessel 16 is provided with the vacuum vessel flange 161.

A heat insulating support 24 is made of a member having a low thermal conductivity and supports the low-temperature-side highly thermal conductor 3 with an upper flange of the heat shield 12.

A permanent current switch 4 is a switch that is wound around a winding frame 41 along with the superconducting coil 1. The permanent current switch 4 and the winding frame 41 are connected to a highly thermal conductor 5 so that the temperature of the permanent current switch 4 becomes nearly equal to the temperature of the highly thermal conductor 5. A lower surface of the highly thermal conductor 5 is connected to an upper portion of a heat insulator 6. A lower surface of the heat insulator 6 is connected to the low-temperature-side highly thermal conductor 3. The heat insulator 6 is made of austenitic stainless steel having a low thermal conductivity or an FRP of carbon fiber, glass fiber, and aluminum fiber that hardly conduct heat.

A liquid storage chamber 7 is a space for condensate liquid supplied from a condenser 11 that condenses gas supplied from a gas bottle 8. The condenser 11 will be described later. The gas supplied to the liquid storage chamber 7 is helium, hydrogen, argon, nitrogen, or the like. If the gas supplied from the gas bottle 8 is helium, the refrigerating capacities of the first stage 21 and the second stage 22 of the refrigerating unit 2 are 60 W @ 40 K and 1 W @ 4.2 K, respectively, and the gas pressure is the atmospheric pressure, when the gas at room temperature passes from the gas bottle 8 to the first stage 21 of the refrigerating unit 2, the temperature of the gas lowers to approximately 60 K or below. In addition, when the gas passes through the condenser 11 of a highly thermal conductor 110 thermally connected to the second stage 22 through the low-temperature-side highly thermal conductor 3, the temperature of the gas becomes approximately 4.2 K. In addition, liquid helium having a temperature of 4.2 K or higher flows in the liquid storage chamber 7.

Next, a gas pipe that supplies gas from the gas bottle 8 to the liquid storage chamber 7 will be described.

A pipe 26 is connected between the gas bottle 8 and a pressure regulation valve 9 and between the pressure regulation valve 9 and a gas chamber 10. A first pipe 14 and a second pipe 15 each connect the gas chamber 10 and the liquid storage chamber 7. The first pipe 14 and the second pipe 15 are pierced through the vacuum vessel 16. Most of these pipes except a part of them are made of stainless steel.

The first pipe 14 is pierced through the heat shield flange 121 and is wound around outer circumferences of the first stage 21 of the refrigerating unit 2 and the highly thermal conductor 110. A part of the first pipe 14 that is wound around the highly thermal conductor 110 corresponds to the condenser 11. A part of the first pipe 14 that comes into contact with the condenser 11 is a pipe having inner grooves that allow gas supplied from the gas bottle 8 to be effectively liquefied. The condenser 11 is made of high purity copper that allows efficiency of fins disposed between the inner grooves to improve. The condenser 11 that is wound around the outer circumference of the highly thermal conductor 110 is connected to a check valve 13 and the liquid storage chamber 7 through the first pipe 14. The check valve 13 is a value that prevents the condensate liquid from flowing backward and entering the first pipe 14 when the inner pressure of the liquid storage chamber 7 becomes high.

The second pipe 15 is piping that mainly serves to return gas from the liquid storage chamber 7 to the gas chamber 10. The second pipe 15 disposed in the heat shield 121 is pierced through the heat shield flange 12 and is wound around the first stage 21. In addition, the second pipe 15 is pierced through the vacuum vessel flange 161 and is connected to the gas chamber 10. Since the second pipe 15 is wound around the first stage 21, the temperature of the second pipe 15 is lowered so as to decrease the amount of heat that is conducted from the second pipe 15 to the liquid storage chamber 7. Alternatively, when the second pipe 15 and the heat shield flange 121 are connected with a copper adhesive tape or an aluminum adhesive tape, they serve as a thermal anchor that causes the temperature of a portion of the second pipe 15 pierced through the heat shield flange 121 to become equal to the temperature of the heat shield 12. These methods are effective to lower the amount of heat.

A second check valve 25 is disposed between the pressure regulation valve 9 and the gas chamber 10 so as to prevent a part that is connected between the first pipe 14 and the second pipe 15 from breaking if the inner pressure of the pipe 26 becomes abnormally high. The second check valve 25 serves to prevent atmospheric air from entering the pipe 26 when the inner gas pressure of the pipe 26 is equal to or lower than the atmospheric pressure.

Next, a structure that moves the liquid storage chamber 7 upward and downward will be described.

A micrometer head 17 protrudes on an upper surface side of the vacuum vessel flange 161 so that a shaft 18 connected to a lower end of the micrometer head 17 is moved upward and downward while the shaft 18 is not rotated. The upward and downward movements of the shaft 18 are mechanically (physically) transferred to the liquid storage chamber 7 through a high-temperature-side conduction member 19 that is made of austenitic stainless steel and that has a solid column shape, a block 20, and a low-temperature-side conduction member 27. As the liquid storage chamber 7 is moved upward and downward, a distance between an upper surface of the highly thermal conductor 5 and a lower surface of the liquid storage chamber 7 can be mechanically changed. According to the present embodiment, a moving unit is composed of the micrometer head 17, the shaft 18, the high-temperature-side conduction member 19, the block 20, and the low-temperature-side conduction member 27. These members are made from materials having low thermal conductivities so that these members prevent heat from being conducted from the shaft 18 to the liquid storage chamber 7. Since the low-temperature-side conduction member 27 and the high-temperature-side conduction member 19 are stressed by compression and tension, these materials would be an FRP made of carbon fiber, glass fiber, or aluminum fiber.

The block 20 is disposed between a lower end of the high-temperature-side conduction member 19 connected to the shaft 18 of the micrometer head 17 and an upper end of the low-temperature-side conduction member 27 connected to the liquid storage chamber 7. The block 20 is thermally connected to the heat shield flange 121 through a bellows 28. Since the heat shield flange 121 is connected to the first stage, the block 20 is maintained at a low temperature. The block 20 shuts off heat from the high-temperature-side conduction member 19. In addition, since the block 20 is maintained at a low temperature, the block 20 decreases the amount of heat that is conducted from the low-temperature-side conduction member 27 to the liquid storage chamber 7. The block 20 and the bellows 28 are made of materials having high thermal conductivities such as copper or copper alloy.

A bellows 23 is sandwiched by the shaft 18 and the high-temperature-side conduction member 19. The bellows 23 keeps the interior of the vacuum vessel 16 in vacuum and allows the shaft 18 and so forth to be easily moved upward and downward. The bellows 23 is connected to the vacuum vessel flange 161.

In addition, the first pipe 14 has a spiral member 141, whereas the second pipe 15 has a spiral member 151. The spiral member 141 and the spiral member 151 are formed in a spring shape so that they allow the liquid storage chamber 7 to be moved upward and downward with weak force. In addition, the spiral members 141 and 151 decrease stresses applied to the first pipe 14 and the second pipe 15, respectively.

FIG. 2 is a sectional view showing the superconducting magnet where the liquid storage chamber 7 disposed above the permanent current switch 4 is moved upward with the micrometer head 17 disposed outside the vacuum vessel 16. When the shaft 18 of the micrometer head 17 is moved upward, each of the high-temperature-side conduction member 19, the block 20 and the low-temperature-side conduction member 27 is moved upward as the shaft 18 is moved. Likewise, the liquid storage chamber 7 is moved upward.

The liquid storage chamber 7 that hangs is connected to the low-temperature-side conduction member 27, the first spiral member 141, and the second spiral member 151. However, since their high temperature portions are secured to the heat shield flange 121 and the check valve 13 that are low temperature portions, the amount of heat of the liquid storage chamber 7 is small. Thus, the condensate liquid condensed by the condenser 11 flows to and stays in the liquid storage chamber 7.

Thus, when the micrometer head 17 is rotated, the distance between the highly thermal conductor 5 and the liquid storage chamber 7 can be mechanically changed. When the liquid storage chamber 7 is moved downward, the distance between the upper surface of the highly thermal conductor 5 and the lower surface of the liquid storage chamber 7 becomes the shortest, preferably they come into contact with each other. As a result, the amount of conduction heat between the liquid storage chamber 7 and the highly thermal conductor 5, namely, the permanent current switch 4, is increased. In contrast, when the lower surface of the liquid storage chamber 7 is moved upward, the distance between the upper surface of the highly thermal conductor 5 and the lower surface of the liquid storage chamber 7 is increased. As a result, the amount of conduction heat between the liquid storage chamber 7 and the highly thermal conductor 5, namely the permanent current switch 4, is decreased.

FIG. 3 shows an electric circuit that excites the superconducting coil 1. In FIG. 3, the permanent current switch 4 is a portion surrounded by dotted lines and is composed of a coil-shaped superconducting wire 42 and a heater 43. Both ends of the superconducting wire 42 are connected to both ends of wiring of the superconducting coil 1. The electric circuit also has a power supply 200 for a heater 43, a power supply 300 that excites the superconducting coil 1, a switch 201 connected in series to the heater 43, two switches 301 for the superconducting coil 1, and a lead wire 44 that connects these members and that is made of a high-temperature superconducting material, to excite the superconducting coil 1. The superconducting coil 1 is connected to the power supply 300 through a switch 301. In addition, the heater power supply 200 that energizes the heater 43 in the permanent current switch 4 is connected through the switch 201. A magnetic sensor that checks if the superconducting coil 1 has been excited may be optionally disposed in the electric circuit.

With reference to FIG. 1 to FIG. 3, an excitation operation of the superconducting coil 1 will be described.

In an initial state (before the superconducting coil 1 is excited), it is assumed that the superconducting coil 1 and the permanent current switch 4 remain in the superconducting state where their temperatures are below 20 K. In addition, it is assumed that the lead wire 44 that connects the permanent current switch 4 and the superconducting coil 1 is also a high-temperature superconducting wire and remains in the superconducting state. Moreover, it is assumed that since both the switch 201 and the switch 301 are open, no current flows in the circuit composed of the superconducting coil 1 and the superconducting wire 42. In these conditions, as shown in FIG. 1, the liquid storage chamber 7 comes into contact with the highly thermal superconductor 5 disposed on the winding frame 41 around the permanent current switch 4. Thus, the temperatures of the permanent current switch 4 and the superconducting coil 1 are below the superconducting critical temperature of the superconducting wire. As a result, the permanent current switch 4 and the superconducting coil 1 remain in the superconducting state.

When the superconducting coil 1 is excited, as shown in FIG. 2, the liquid storage chamber 7 is moved away from the highly thermal conductor 5 with the micrometer head 17 disposed outside the vacuum vessel 16. At this point, when the heater 43 disposed in the permanent current switch 4 does not generate heat, since the amount of conduction heat and the amount of radiation heat that are conducted and radiated from the high temperature side are small, the temperature of the permanent current switch 4 is nearly equal to that of the low-temperature-side highly thermal conductor 3. Thus, the temperature of the superconducting wire 42 in the permanent current switch 4 is below the superconducting critical temperature.

When current is supplied from the power supply 300 to the superconducting coil 1, the superconducting wire in the permanent current switch 4 needs to become the normal conducting state. When the switch 201 is turned on, the heater power supply 200 supplies current to the heater 43 in the permanent current switch 4 so as to energize the heater 43. The heat generated by the heater 43 is conducted to the superconducting wire 42 in the permanent current switch 4. As a result, the temperature of the superconducting wire 42 becomes greater than the critical temperature. The superconducting wire 42 becomes the normal conducting state.

Thereafter, when the switch 301 is turned on, the power supply 300 supplies current to the superconducting coil 1 so that preset current flows in the superconducting coil 1. At this point, since the permanent current switch 4 comes into contact with the heat insulator 6, the permanent current switch 4 remains in the heat insulating state. Thus, even if a small amount of energy is supplied to the heater 43, it can raise the temperature of the permanent current switch 4.

Current having a preset value is supplied to the superconducting coil 1 until a magnetic field generated by the superconducting coil 1 becomes stable. After the magnetic field becomes stable, the heater power supply 200 is caused to stop supplying the current to the heater 43 of the permanent current switch 4 so that the heater 43 stops heating the superconducting wire 42 and the permanent current switch 4 is turned on (closed). At this point, the temperature of the permanent current switch 4 is greater than the superconducting critical temperature of the superconducting wire 42.

As described above, as the temperature of the permanent current switch 4 is lowered, the temperature of the superconducting wire 42 of the permanent current switch 4 is quickly lowered and the superconducting wire 42 likely becomes the superconducting state. As a result, the excitation time can be shortened.

Thus, the liquid storage chamber 7 is moved downward from the state shown in FIG. 2 with the micrometer head 17 disposed outside the vacuum vessel 16 so that the liquid storage chamber 7 is connected to the highly thermal conductor 5. FIG. 1 shows that the liquid storage chamber 7 has been connected to the highly thermal conductor 5. When the liquid storage chamber 7 just comes into contact with the highly thermal conductor 5, heat of the highly thermal conductor 5 (heat generated by the heater 43 of the permanent current switch 4) causes a bottom plate of the liquid storage chamber 7 to be heated. As a result, the condensate liquid in the liquid storage chamber 7 boils and generates many bubbles. They cause the inner pressure of the liquid storage chamber 7 to rise. Since the condensate liquid deprives heat due to latent heat of vaporization and refrigerates the bottom plate of the liquid storage chamber 7. As a result, the permanent current switch 4 is refrigerated below 20 K.

Refrigerating energy E(J) that causes the normal conducting state of the superconducting wire 42 in the permanent current switch 4 to be changed to the superconducting state can be obtained from the following formula (1), where $T_h(K)$ represents the temperature at which the superconducting wire 42 is maintained in the normal conducting state, $T_l(K)$ represents the temperature at which the superconducting wire 42 is maintained in the superconducting state, $m_i(kg)$ represents mass $m_i(kg)$, and $c_i(J/kg/K)$ represents specific heat.

[Mathematical Formula 1]

$$E = \Sigma m_i \int_{Tl}^{Th} C_i dT \qquad (1)$$

Since E(J) is equal to the amount of consumption of the condensate liquid, consumed liquid mass $m_1(kg)$ can be also calculated by the following formula (2), where L represents latent heat of vaporization (J/kg).

[Mathematical Formula 2]

$$m_1 = E/L \qquad (2)$$

The boiling heat conduction is known to have a higher refrigerating characteristic than the natural convection and forced convection heat conduction. Thus, the permanent current switch 4 can be quickly refrigerated. Since the superconducting wire 42 in the permanent current switch 4 is quickly changed to the superconducting state, the permanent current switch 4 can be refrigerated in a short time. As a result, since the operation that causes the power supply 300 of the superconducting coil 1 not to supply current can be quickened, the boiling heat conduction contributes to shorten the excitation time for the superconducting coil 1.

At this point, when the condensate liquid boils, it becomes gas and thereby the inner pressure of the liquid storage chamber 7 rises. However, since the check valve 13 is disposed in the first pipe 14, the condensate liquid does not flow backward. If the check valve 13 is not disposed in the first pipe 14, since the condensate liquid flows backward, it is lost. Thus, the check valve 13 can prevent the condensate liquid from being lost.

Since the check valve 13 generally has directivity, it prevents liquid from flowing backward, but allows it to flow forward. When liquid flows backward, the check valve 13 closes. When liquid flows forward, the check valve 13 opens. The check valve 13 uses a spring type mechanism or a gravity type mechanism to open and close. The minimum open/close pressure difference of a spring type check valve that is commercially available is approximately 2 kPa. The gravity type check valve needs to be disposed so that it opens and closes in the vertical direction. The gravity type check valve is operable under a very low temperature condition. The open/close pressure difference of the gravity type check valve made of a low density aluminum alloy was below approximately 1 kPa. Thus, the open/close pressure difference of the check valve is small. In addition, the check valve 13 allows gas in the liquid storage chamber 7 to flow only in the second pipe. Thus, since the condensate liquid in the condenser 11 does not move to the first stage, the condensate liquid is prevented from being wasted and the permanent current switch 4 can be quickly refrigerated. In addition, when the inner pressure in the liquid storage chamber 7 lowers, the condensate liquid is supplied from the condenser 11 to the liquid storage chamber 7.

When the temperature of the permanent current switch 4 becomes below 20 K and the permanent current switch 4 returns to the superconducting state, preset current flows in the superconducting coil 1 and the superconducting wire 42 of the permanent current switch 4.

After the permanent current switch 4 returns to the superconducting state, when current that flows from the power supply 300 is gradually stopped and then the switch 301 is turned off, the excitation operation is completed. As a result, current semi-permanently flows in the superconducting coil 1 made of only the superconducting wire and the circuit made of only the superconducting wire 42 and thereby the superconducting coil 1 continuously generates a magnetic field.

As described above, according to the present embodiment, the superconducting coil 1 has a superconducting magnet structure in which the superconducting coil 1 is connected to the second stage 22 of the refrigerating unit 2 through the low-temperature-side highly thermal conductor 3 and that the permanent current switch 4 covered by the highly thermal conductor 5 is connected to the second stage 22 of the refrigerating unit 2 through the heat insulator 6 and the low-temperature-side highly thermal conductor 3. Gas is supplied from the gas bottle 8 disposed outside the vacuum vessel 16 to the condenser 11 of the heat shield 12. In addition, the first pipe 14 that supplies the condensate liquid to the liquid storage chamber 7 is provided. The liquid storage chamber 7 is disposed above the permanent current switch 4. The check valve 13 is connected to the first pipe 14.

This structure allows the permanent current switch 4 to be refrigerated with the boiling heat conduction of the condensate liquid of the liquid storage chamber 7. The superconducting wire 42 of the permanent current switch 4 can be quickly changed to the superconducting state. As a result, the excitation time can be shortened. In addition, even if the condensate liquid boils and thereby the inner pressure of the liquid storage chamber 7 rises, the check valve 13 prevents the condensate liquid in the liquid storage chamber 7 from flowing backward. Thus, the superconducting magnet that can quickly refrigerate the permanent current switch 4 can be accomplished without wasting of the condensate liquid.

A mechanical operation performed outside the vacuum vessel 16 causes the liquid storage chamber 7 to come into contact with and to move away from the highly thermal conductor 5 neighboring the permanent current switch 4. Specifically, when the permanent current switch 4 is turned "OFF," the liquid storage chamber 7 is caused to move away from the highly thermal conductor 5 neighboring the permanent current switch 4 so that the liquid storage chamber 7 is heated by the heater 43 in the permanent current switch 4. As a result, the permanent current switch 4 can be turned "OFF" with a small amount of heat energy. In contrast, when the permanent current switch 4 is turned "ON," a mechanical operation performed outside the vacuum vessel 16 causes the liquid storage chamber 7 to come into contact with the highly thermal conductor 5 neighboring the permanent current switch 4. As a result, the condensate liquid in the liquid storage chamber 7 boils and refrigerates the permanent current switch 4. Thus, since the permanent current switch 4 can be quickly refrigerated, the excitation time of the superconducting magnet 1 can be shortened. In other words, the permanent current switch 4 can be turned "ON" in a short time. Since the switching time of the permanent current switch 4 is shortened, the excitation time can be further shortened. Thus, since the heat energy of the heater is decreased in the excitation time, the operation cost of the refrigerating unit can be reduced.

Second Embodiment

Next, with reference to FIG. 4, a superconducting magnet according to a second embodiment of the present invention will be described. In the embodiments that follow, similar portions to those in FIG. 1 will be represented by similar reference numerals.

Figure 4:
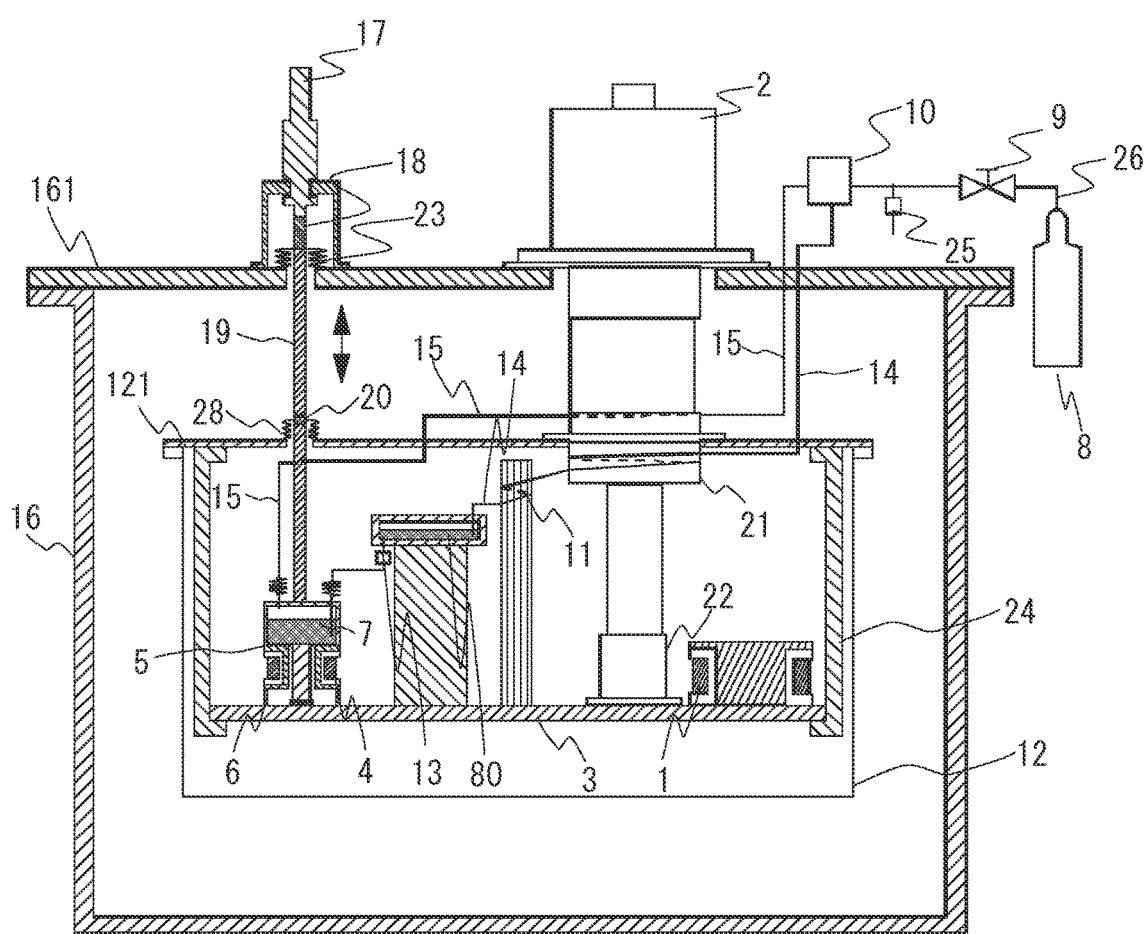
FIG. 4 is a schematic diagram showing an example of a cross section of a superconducting magnet according to a second embodiment of the present invention.

FIG. 4 is a sectional view showing the superconducting magnet according to the present embodiment.

As shown in FIG. 4, assuming that a liquid capacity of a liquid storage chamber 7 is small and an amount of consumed liquid is insufficient, a second liquid storage chamber 80 is provided in the superconducting magnet according to the present embodiment.

The second liquid storage chamber 80 is disposed between the liquid storage chamber 7 and a condenser 11. The second liquid storage chamber 80 is disposed on an upper end side of a second liquid storage chamber's highly thermal conductor 81 disposed above a low-temperature-side highly thermal conductor 3.

A first pipe 14 that connects the condenser 11 and the second liquid storage chamber 80 is used as a supply pipe for condensate liquid to the second liquid storage chamber 80. The first pipe 14 that connects the second liquid storage chamber 80 and the liquid storage chamber 7 is used as a condensate liquid discharge pipe for the second liquid storage chamber 80.

A check valve 13 is disposed between the condensate liquid discharge pipe for the second liquid storage chamber 80 and the first pipe 14 disposed on an upstream side of a first spiral pipe 141.

Since the structure of the other portions of the superconducting magnet according to the second embodiment is the same as that according to the first embodiment, the description thereof is omitted.

The superconducting magnet according to the second embodiment of the present invention also provides nearly the same effect as the superconducting magnet according to the first embodiment.

In addition, since the condensate liquid is stored in two spaces of the liquid storage chamber 7 and the second liquid storage chamber 80, the liquid storage chamber 7 can be down-sized. Moreover, the liquid storage chamber 7 that is down-sized allows the liquid storage chamber 7 to be moved upward and downward more easily than that according to the first embodiment.

Third Embodiment

Next, with reference to FIG. 5 to FIG. 7, a superconducting magnet according to a third embodiment of the present invention will be described.

Figure 5:
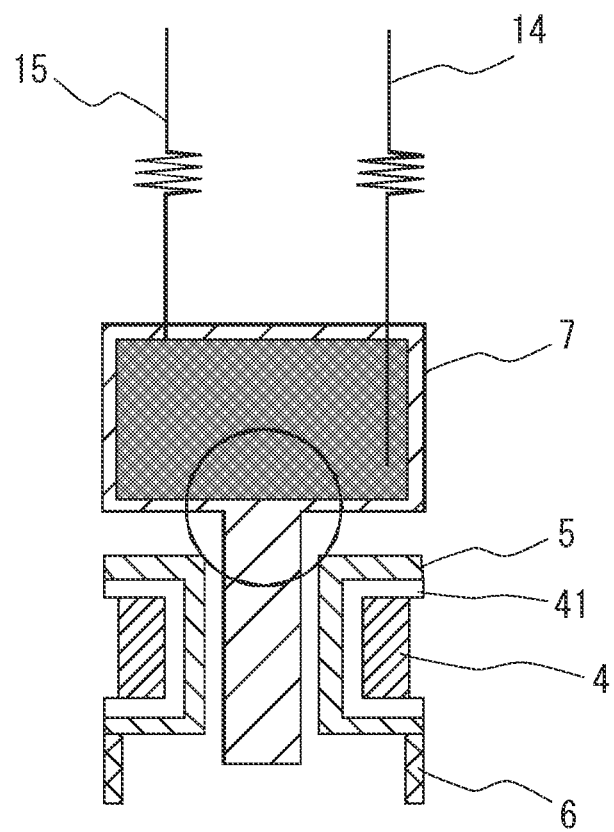
FIG. 5 is a schematic diagram showing an example of a cross section of a portion neighboring a liquid storage chamber of a superconducting magnet according to a third embodiment of the present invention.

FIG. 5 is a sectional view showing an area neighboring a liquid storage chamber of the superconducting magnet according to the present embodiment. FIG. 6 is a partially enlarged view of FIG. 5. FIG. 7 is a pool boiling characteristic diagram.

Figure 6:
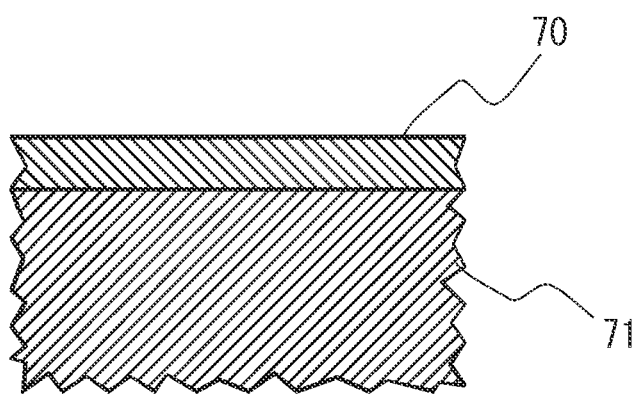
FIG. 6 is a schematic diagram showing an example of a cross section of a bottom surface portion of the liquid storage chamber (shown in FIG. 5) of the superconducting magnet according to the third embodiment of the present invention.

As shown in FIG. 5 and FIG. 6, in the superconducting magnet according to the present embodiment, a film 70 is disposed on a bottom plate 71 of a liquid storage chamber 7 so that the film 70 faces the liquid storage chamber 7. The bottom plate 71 is made of copper having a high thermal conductivity.

The film 70 is an epoxy polymer film having a thermal conductivity that decreases by a factor of $1/10$ when the temperature is lowered from the room temperature to 4 K. The film 70 is an epoxy resin film coated on the bottom plate 71.

Alternatively, a foil instead of the film 70 may be disposed on the bottom plate 71 of the liquid storage chamber 7 so that the foil faces the liquid storage chamber 7. The foil is a stainless steel thin plate having a thickness in the range from 10 μm to 500 μm. The stainless foil is secured on the front surface of the bottom plate 71 with an epoxy adhesive agent.

Since the structure of the other portions of the superconducting magnet according to the third embodiment is the same as that according to the first embodiment, the description thereof is omitted.

Figure 7:
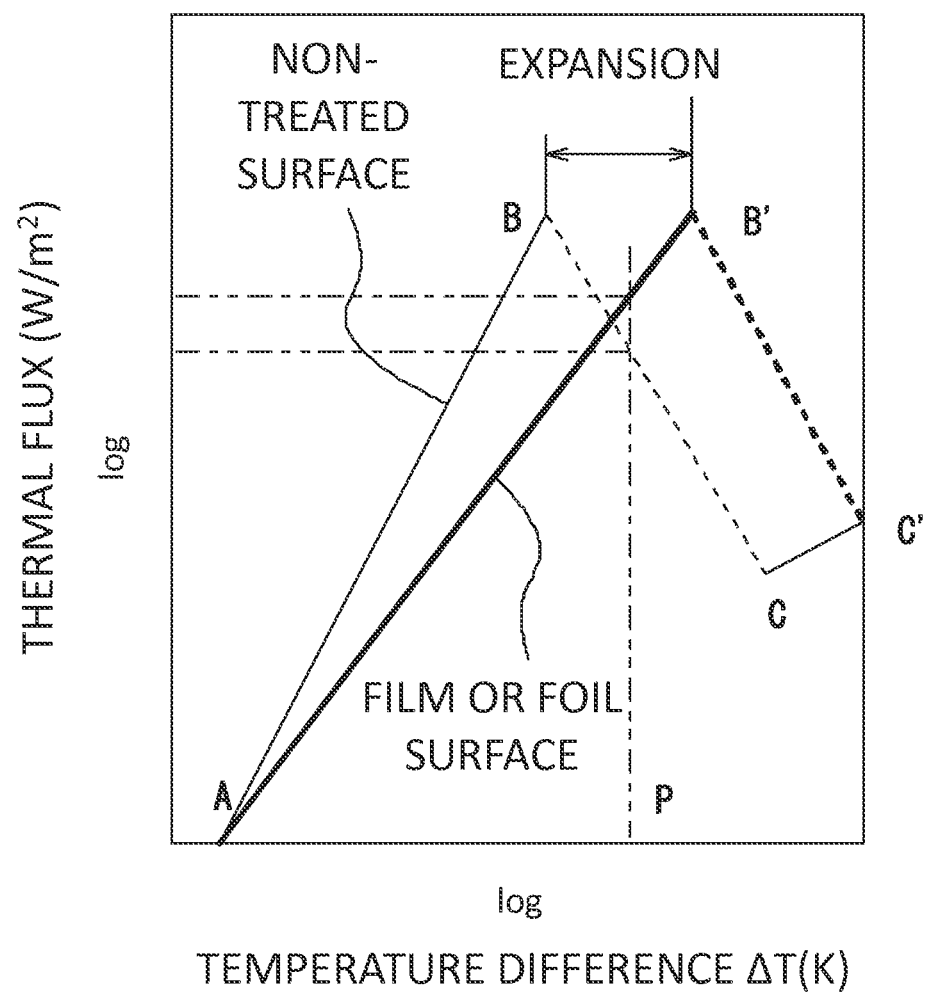
FIG. 7 is a pool boiling characteristic diagram of the superconducting magnet according to the third embodiment of the present invention.

FIG. 7 is a schematic diagram showing boiling characteristics of an untreated bottom plate where neither a film nor a foil is disposed on the bottom plate and a treated bottom plate where a film or a foil is disposed on the bottom plate. The horizontal axis represents a log scale of temperature difference ΔT of the bottom plate and the liquid, whereas the vertical axis represents a log scale of a heat flux. The untreated surface is represented by solid and broken thin lines, whereas the treated surface is represented by solid and broken thick lines. Line A–B of the untreated surface represents a nucleate boiling area, whereas line B–C of the untreated surface represents a transition area between film boiling (C–C') and nucleate boiling. Line A–B' on the film or foil coated surface represents a nucleate boiling area, whereas line B'–C on the film or foil coated surface represents a transition area.

As shown in FIG. 7, the nucleate boiling areas of these surfaces have the maximum heat flux value. The maximum heat flux value on the film or foil coated surface is greater than temperature difference ΔT on the untreated surface. Next, with reference to FIG. 7, these reasons will be described.

As the amount of heat increases, the heat resistance of the film or foil is added to temperature difference ΔT. Thus, the maximum heat flux of the bottom plate 71 becomes greater than the maximum heat flux on the untreated surface having temperature difference ΔT. When the temperature difference is P, the heat flux in the nucleate boiling area (A–B') on the treated surface is greater than that in the transition boiling area (B–C) on the untreated surface. Thus, it takes time before a transition to the nucleate boiling area occurs. As a result, since the bottom plate 71 can be refrigerated in the nucleate boiling area for a long time, the refrigerating speed can be further increased.

The superconducting magnet according to the third embodiment of the present invention also provides nearly the same effect as the superconducting magnet according to the first embodiment.

In addition, the film or foil is disposed on the bottom plate 71 of the liquid storage chamber 7 so that the film or foil faces the liquid storage chamber 7. Thus, the bottom plate 71 can be refrigerated in the nucleate boiling area for a long time. As a result, the refrigerating speed can be further increased.

Fourth Embodiment

Next, with reference to FIG. 8 and FIG. 9, a superconducting magnet according to a fourth embodiment of the present invention will be described.

Figure 8:
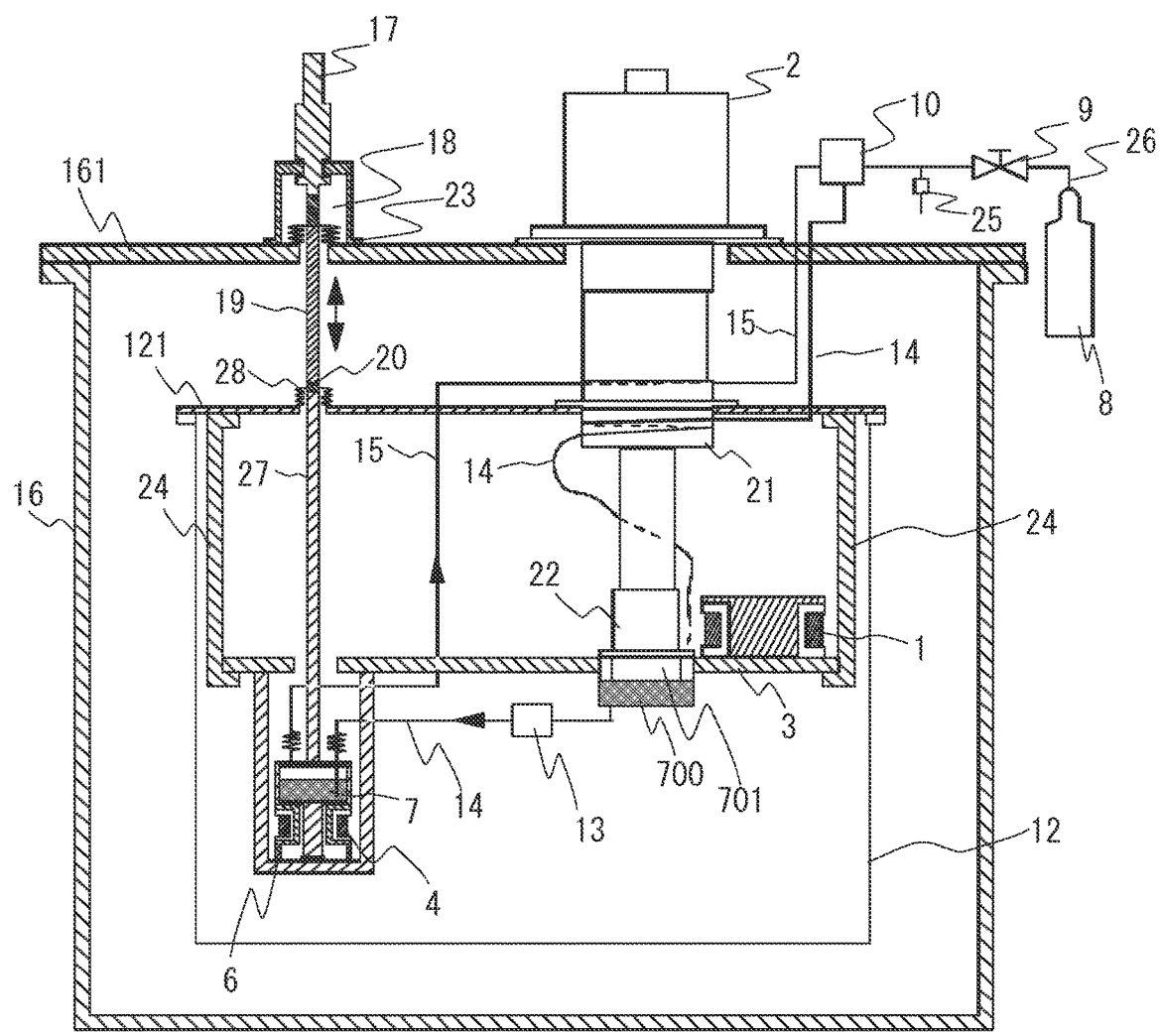
FIG. 8 is a schematic diagram showing an example of a cross section of a superconducting magnet according to a fourth embodiment of the present invention.
Figure 9:
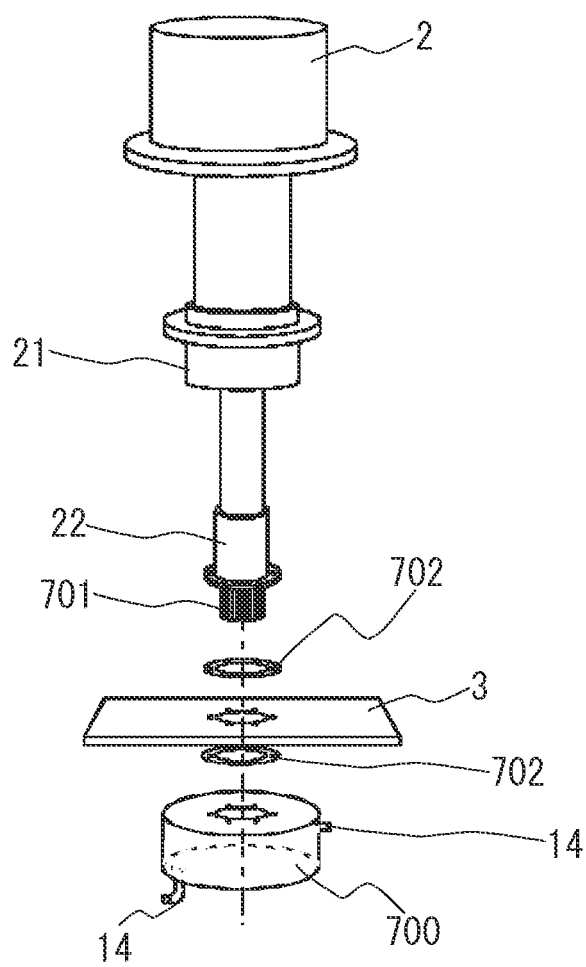
FIG. 9 is an exploded view showing parts neighboring a refrigerating unit and a heat exchanger of the superconducting magnet according to the fourth embodiment of the present invention.

FIG. 8 is a sectional view showing the superconducting magnet according to the present embodiment. FIG. 9 is an exploded view showing parts neighboring a refrigerating unit and a heat exchanger according to the present embodiment.

In FIG. 8, a condensate liquid storage chamber 700 is disposed below a low-temperature-side highly thermal conductor 3 so that the condensate liquid storage chamber 700 is perpendicular to the low-temperature-side highly thermal conductor 3. Since the condensate liquid storage chamber 700 supplies condensate liquid to a liquid storage chamber 7 that refrigerates a permanent current switch 4 as the condensate liquid gravitates, the liquid storage chamber 7 is disposed at a position lower than the condensate liquid storage chamber 700 and the low-temperature-side highly thermal conductor 3. Disposed in the condensate liquid storage chamber 700 is a condensate liquid heat exchanger 701.

Next, with reference to FIG. 9, a structure in which the condensate liquid heat exchanger 701 and a refrigerating unit 2 are connected will be described. The condensate liquid heat exchanger 701 disposed in a second stage 22 of the refrigerating unit 2 is provided with many fins. Indium foils 702 are disposed at front and rear portions where the condensate liquid heat exchanger 701 and a low-temperature-side highly thermal conductor 3 come into contact with each other. The front-side indium foil 702 prevents a vacuum leak from occurring between the second stage 22 and the low-temperature-side highly thermal conductor 3. Likewise, the rear-side indium foil 702 prevents a vacuum leak from occurring between the low-temperature-side highly thermal conductor 3 and the condensate liquid storage chamber 700.

As the superconducting magnet according to the first embodiment, the liquid storage chamber 7 is moved upward and downward with a micrometer head 17 disposed outside a vacuum vessel 16. According to the present embodiment, the low-temperature-side highly thermal conductor 3 is cut. The liquid storage chamber 7, a permanent current switch 4, a winding frame 41, and a highly thermal conductor 5 are disposed below the low-temperature-side highly thermal conductor 3 so that even if the liquid storage chamber 7 does not come into contact with the highly thermal conductor 5, the temperature of the permanent current switch 4, the winding frame 41, and the highly thermal. conductor 5 nearly becomes equal to the temperature of the low-temperature-side highly thermal conductor 3.

Since the structure of the other portions of the superconducting magnet according to the present embodiment is the same as that according to the first embodiment, the description thereof is omitted.

According to the present embodiment, gas is supplied from a gas bottle 8 to the condensate liquid storage chamber 700 through a gas chamber 10, a first pipe 14, and a first stage 21 of a refrigerating unit 2. The first stage 21 refrigerates the gas and the condensate liquid heat exchanger 701 liquidities the gas. The condensate liquid is supplied to the liquid storage chamber 7 through the first pipe 14 that connects the condensate liquid storage chamber 700 and a check valve 13 and that connects the check valve 13 and a first spiral pipe 141. A second pipe 15 that serves for a gas discharge pipe of the liquid storage chamber 7 is the same as the second pipe 15 according to the first embodiment.

The superconducting magnet according to the fourth embodiment of the present invention also provides nearly the same effect as the superconducting magnet according to the first embodiment.

When the condensate liquid heat exchanger 701 is directly connected to the second stage 22 of the refrigerating unit 2, the condensate liquid heat exchanger 701 can be used at the lowest temperature. Since temperature difference (Tg–Tw) between gas temperature Tg in the condensate liquid storage chamber 700 and heat exchanger temperature Tw becomes large, the condenser has high liquefaction efficiency. In contrast, since the temperature difference becomes large, the thermal conduction area of fins of the condensate liquid heat exchanger 701 can be decreased so that the condensate liquid heat exchanger 701 and the condensate liquid storage chamber 700 are down-sized.

Fifth Embodiment

The superconducting magnets according to the first to fourth embodiments that have been described above can be applied to MRI superconducting magnets used for imaging devices for human bodies or to NMR superconducting magnets used for analysis of molecular structures.

Next, with reference to FIG. 10, an example of an MRI apparatus according to an embodiment of the present invention will be described.

Figure 10:
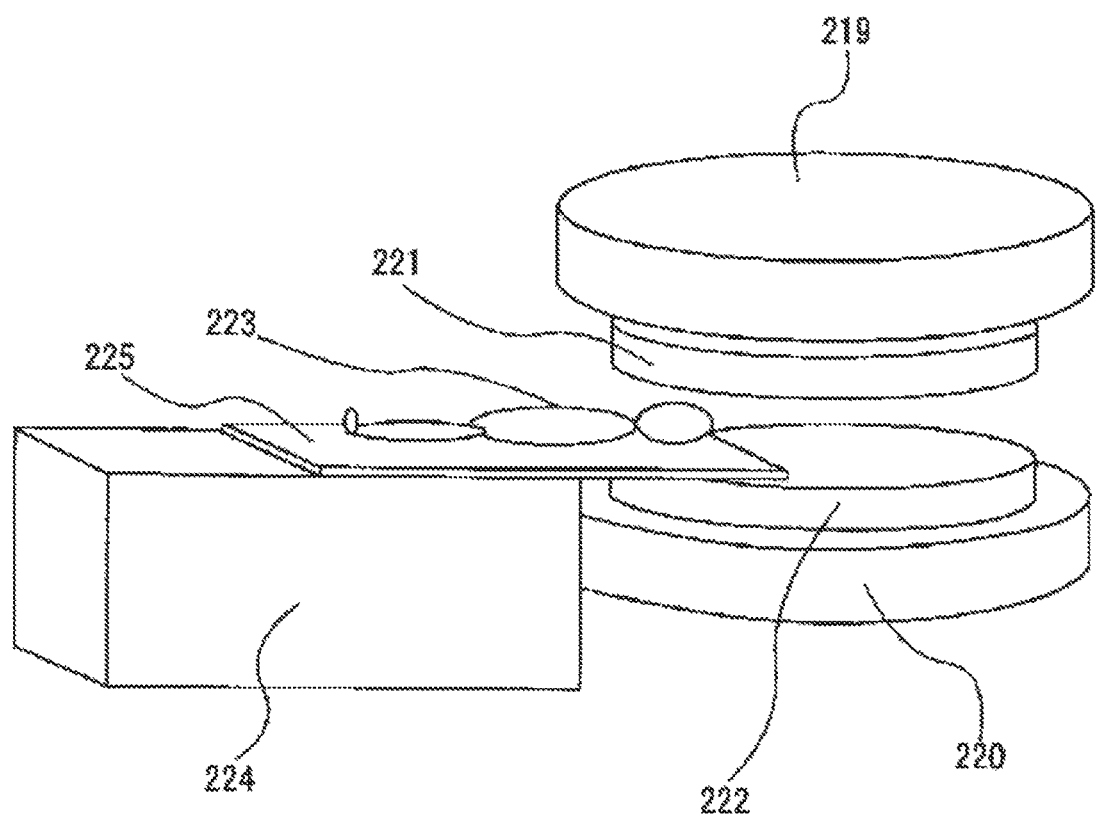
FIG. 10 is an external view showing an open type MRI apparatus having a superconducting magnet according to the present invention.

FIG. 10 is an external view showing an open type MRI apparatus having a superconducting magnet.

As shown in FIG. 10, in the MRI apparatus, superconducting magnets that generate coil-shaped magnetic fields are disposed in an upper vacuum container 219 and a lower vacuum container 220, respectively. The superconducting magnets generate uniform upward and downward magnetic fields, respectively. A patient 223 is conveyed by a bed 225 of an elevating device 224 to a space between an upper sound insulation vessel 221 and a lower sound insulating vessel 222.

The superconducting magnets according to the first to fourth embodiments may be disposed in an NMR apparatus as well as the MRI apparatus shown in FIG. 10.

Others

The present invention is not limited to the foregoing embodiments. The present invention may include various modifications of these embodiments. The foregoing embodiments describe the present invention in details so that it can be easily understood. The embodiments of the present invention are not limited to those that have all the structures that have been described. In addition, a part of the structure of one embodiment may be substituted with the structure of another embodiment. Alternatively, the structure of one embodiment may be added to the structure of another embodiment. A part of the structure of each embodiment may be added to, subtracted from, and/or substituted with the structure of another embodiment.

REFERENCE SIGNS LIST

1 . . . superconducting coil
2 . . . refrigerating unit
3 . . . low-temperature-side highly thermal conductor
4 . . . permanent current switch
5 . . . highly thermal conductor
6 . . . heat insulator
7 . . . liquid storage chamber
8 . . . gas bottle
9 . . . pressure regulation valve
10 . . . gas chamber
11 . . . condenser
12 . . . heat shield
13 . . . check valve
14 . . . first pipe
15 . . . second pipe
17 . . . micrometer head
19 . . . high-temperature-side conduction member
21 . . . first stage
22 . . . second stage
24 . . . heat insulating support
25 . . . second check valve 41 . . . winding frame
42 . . . superconducting wire
43 . . . heater
70 . . . film or foil
700 . . . condensate liquid storage chamber
701 . . . condensate liquid heat exchanger
702 . . . indium foil

The invention claimed is:

1. A superconducting magnet comprising:
    a refrigerating unit;
    a vacuum vessel;
    a thermal conductor disposed in the vacuum vessel;
    a permanent current switch that is thermally connected to the refrigerating unit through the thermal conductor and that has a superconducting coil disposed in the vacuum vessel;
    a liquid storage chamber;
    a condenser;
    a first pipe that supplies gas from an outer portion of the vacuum vessel to the liquid storage chamber through the condenser;
    a second pipe that discharges the gas from the liquid storage chamber to the outer portion of the vacuum vessel; and
    a check valve disposed at the first pipe so as to prevent a gas flow from the liquid storage chamber to the outer portion of the vacuum vessel.

2. The superconducting magnet according to claim 1, wherein the permanent current switch has a moving unit that is disposed outside of the vacuum vessel and that causes the liquid storage chamber relatively to come into contact with the superconducting coil and move away therefrom.

3. The superconducting magnet according to claim 2, wherein the first pipe and the second pipe respectively have spiral shaped portion.

4. The superconducting magnet according to claim 1, wherein the condenser is a pipe that thermally contacted with a first stage of the refrigerating unit and is thermally connected to the thermal conductor so that the condenser is disposed closer to the liquid storage chamber than a portion where the condenser thermally contacted with the first stage of the refrigerating unit.

5. The superconducting magnet according to claim 4, wherein the condenser is made from a thermally conducting member having inner grooves.

6. The superconducting magnet according to claim 1, wherein the first pipe has a second liquid storage chamber disposed between the liquid storage chamber and the condenser.

7. The superconducting magnet according to claim 1, wherein the condenser includes a heat exchanger connected to the second stage of the refrigerating unit and a liquid storage chamber that is disposed on an outer circumferential side of the heat exchanger and that stores condensate liquid.

8. The superconducting magnet according to claim 1, wherein the liquid storage chamber has a film or a metallic foil disposed on an inner circumferential side of the portion that comes into contact with the superconducting coil.

9. An MRI apparatus comprising a superconducting magnet according to claim 1.

10. An NMR apparatus comprising a superconducting magnet according to claim 1.

* * * * *